(12) United States Patent
Choi (10) Patent No.: US 9,269,864 B2
(45) Date of Patent: Feb. 23, 2016

(54) LIGHT EMITTING DEVICE AND LIGHTING SYSTEM

(71) Applicant: LG INNOTEK CO., LTD., Seoul (KR)

(72) Inventor: Eun Sil Choi, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 14/303,157

(22) Filed: Jun. 12, 2014

(65) Prior Publication Data

US 2014/0367637 A1 Dec. 18, 2014

(30) Foreign Application Priority Data

Jun. 14, 2013 (KR) .................. 10-2013-0068240

(51) Int. Cl.
| | |
|---|---|
| H01L 27/15 | (2006.01) |
| H01L 29/732 | (2006.01) |
| H01L 21/00 | (2006.01) |
| H01L 33/22 | (2010.01) |
| H01L 33/32 | (2010.01) |

(52) U.S. Cl.
CPC ............... *H01L 33/22* (2013.01); *H01L 33/32* (2013.01); *H01L 2933/0091* (2013.01)

(58) Field of Classification Search
CPC ........ B82Y 20/00; B82Y 10/00; H01L 33/20; H01L 33/32; H01L 25/167; H01L 31/105; H01L 31/109; H01L 31/173; H01L 29/2003; H01L 27/14609; H01L 27/14643

USPC ................. 257/12, 13, 79, 80, 184, 189, 290; 438/24, 29, 37, 46, 93

See application file for complete search history.

(56) References Cited

U.S. PATENT DOCUMENTS

| | | | |
|---|---|---|---|
| 2004/0041164 A1 | 3/2004 | Thibeault et al. | 257/98 |
| 2008/0169482 A1 | 7/2008 | Kang | 257/98 |
| 2010/0148199 A1 | 6/2010 | Kim et al. | 257/98 |
| 2011/0243172 A1* | 10/2011 | Lin et al. | 372/45.012 |
| 2012/0161176 A1* | 6/2012 | Heo et al. | 257/98 |
| 2013/0126925 A1 | 5/2013 | Shibata et al. | 257/98 |

FOREIGN PATENT DOCUMENTS

| | | |
|---|---|---|
| EP | 2 595 202 A2 | 5/2013 |
| KR | 10-2004-0016723 A | 2/2004 |
| KR | 10-2008-0050942 A | 6/2008 |

OTHER PUBLICATIONS

European Search Report dated Oct. 24, 2014 issued in Application No. 14 172 143.1.

* cited by examiner

*Primary Examiner* — Hsien Ming Lee
(74) *Attorney, Agent, or Firm* — Ked & Associates, LLP (57) ABSTRACT

A light emitting device includes a first electrode layer, a second conductive semiconductor layer on the first electrode layer, an active layer on the second conductive semiconductor layer, and a first conductive semiconductor layer on the active layer. An $Al_yGa_{1-y}N$ layer (where, $0 \langle y \leq 1$) is provided over the first conductive semiconductor layer, and an $In_xGa_{1-x}N$ pattern (where, $0 \langle x \leq 1$) is provided over the $Al_yGa_{1-y}N$ layer. A gallium nitride semiconductor layer is provided over the $In_xGa_{1-x}N$ pattern; and a pad electrode is provided on the gallium nitride semiconductor layer.

19 Claims, 5 Drawing Sheets

LIGHT EMITTING DEVICE AND LIGHTING SYSTEM

CROSS-REFERENCE TO RELATED APPLICATION(S)

This application claims priority under 35 U.S.C. §119 to Korean Application No. 10-2013-0068240 filed on Jun. 14, 2013, whose entire disclosure(s) is/are hereby incorporated by reference.

BACKGROUND

1. Field

The embodiment relates to a light emitting device, a method of manufacturing the same, a light emitting device package, and a lighting system.

2. Background

A light emitting device (LED) includes a p-n junction diode having a characteristic of converting electric energy into light energy. The p-n junction diode can be formed by combining group III-V elements of the periodic table. The light emitting device can represent various colors by adjusting the compositional ratio of compound semiconductors.

When forward voltage is applied to the LED, electrons of an n layer are bonded with holes of a p layer, so that energy corresponding to an energy gap between a conduction band and a valance band may be generated. This energy is mainly realized as heat or light, and the LED emits the energy as the light.

For example, a nitride semiconductor represents superior thermal stability and wide band gap energy so that the nitride semiconductor has been spotlighted in the field of optical devices and high-power electronic devices. In particular, blue, green, and UV light emitting devices employing the nitride semiconductor have already been developed and extensively used.

According to the relate art, the surface texturing is used based on etching in order to improve light extraction efficiency. However, the reliability of a device and light emitting efficiency are lowered due to the damage to a GaN epitaxial layer caused by the etching.

Further, the surface texturing based on the etching degrades the reproduction.

BRIEF DESCRIPTION OF THE DRAWINGS

The embodiments will be described in detail with reference to the following drawings in which like reference numerals refer to like elements wherein.

DETAILED DESCRIPTION

In the description of embodiments, it will be understood that when a layer (or film) is referred to as being 'on' another layer or substrate, it can be directly on another layer or substrate, or intervening layers may also be present. Further, it will be understood that when a layer is referred to as being 'under' another layer, it can be directly under another layer, and one or more intervening layers may also be present. In addition, it will also be understood that when a layer is referred to as being 'between' two layers, it can be the only layer between the two layers, or one or more intervening layers may also be present.

(Embodiment)

Figure 1:
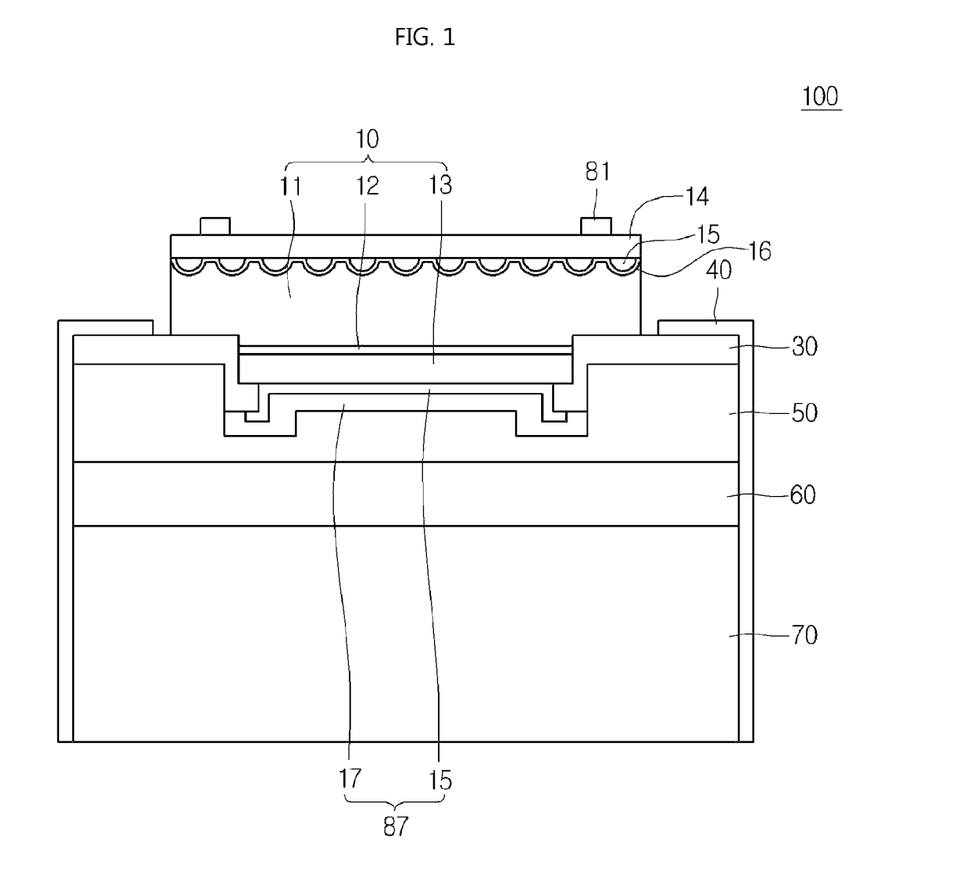
FIG. 1 is a sectional view illustrating a light emitting device according to a first embodiment.

FIG. 1 is a sectional view illustrating a light emitting device 100 according to a first embodiment.

The light emitting device 100 according to a first embodiment may include a first electrode layer 87, a second conductive semiconductor layer 13 on the first electrode layer 87, an active layer 12 on the second conductive semiconductor layer 13, a first conductive semiconductor layer 11 on the active layer 12, an AlyGa1-yN layer (where, 0⟨y≤1) 16 on the first conductive semiconductor layer 11, an InxGa1-xN pattern (where, 0⟨x≤1) 15 on the AlyGa1-yN layer 16, a gallium nitride GaN semiconductor layer 14 on the InxGa1-xN pattern 15, and a pad electrode 81 on the GaN semiconductor layer 14.

According to the related art, the surface texturing is used based on etching in order to improve light extraction efficiency. However, the etching may cause damage to a GaN epitaxial layer so that the reliability of a device and the light emitting efficiency may be lowered. Further, the surface texturing based on the etching may degrade the reproduction.

The embodiment provides the light emitting device capable of improving the light extraction efficiency while maintaining the reliability of the device by preventing an epitaxial layer from being damaged by controlling a refractive index and a shape of the light extraction pattern during a growth of the epitaxial layer.

According to the embodiment, the InxGa1-xN pattern 15 is spirally grown so that the InxGa1-xN pattern 15 may include a section that is convex down. Further, the AlyGa1-yN layer 16 may include a section that is convex down along a surface of the InxGa1-xN pattern 15. Accordingly, light emitted from the active layer is externally scattered through the convex-down sections of the InxGa1-xN pattern 15 and the AlyGa1-yN layer 16 so that the light extraction efficiency may be increased. In detail, according to the embodiment, the InxGa1-xN pattern 15 may be spirally grown on the GaN semiconductor layer 14, for example, a GaN layer through an MOCVD under reduction of an amount of trimethyl gallium TMGa.

The InxGa1-xN pattern 15 may have an island shape. If the GaN semiconductor layer 14 is predeposited with disilane, the InxGa1-xN pattern 15 having the separated island shape may be obtained. The InxGa1-xN pattern 15 having the island shape of a nano scale may very effectively serve as a light extraction pattern. Further, The InxGa1-xN pattern 15 may have the island shape by predepositing Si on the GaN semiconductor layer 14. This is because a side strain is attenuated upon deposition of the InxGa1-xN pattern 15 so that the InxGa1-xN pattern 15 having the separated island shape may be obtained by predepositing Si on the GaN semiconductor layer 14.

The InxGa1-xN pattern 15 may be grown to have a diameter in the range of about 100 nm to about 400 nm. The diameter of the InxGa1-xN pattern 15 may be increased under reduction of a growth rate or reduction of an amount of the trimethyl gallium TMGa. An amount of light reflected into an inside of the light emitting device chip can be minimized through a light extraction structure including a convex section having a micro size and formed on the active layer so that the amount of the emitted light can be maximized. Further, the embodiment may provide a light emitting device including a reproducible and controllable light extraction pattern.

When a diameter of a convex section of the InxGa1-xN pattern 15 is smaller than wavelength of the light, the InxGa1-xN pattern 15 may be formed by a plurality of layers having graded refractive indexes so that the light may be extracted to the outside without substantial reflection. When the diameter of the convex section of the InxGa1-xN pattern 15 is similar to the wavelength of the light, the InxGa1-xN pattern 15 may serve as a scattering center to change a direction of an incident light so that the light extraction efficiency can be increased.

The AlyGa1-yN layer 16 may include an AlN layer or an AlGaN based-layer or may include a super lattice structure such as AlN layer/GaN layer or AlGaN layer/GaN layer. Further, Al composition of the AlyGa1-yN layer 16 may be changed to the range of 0.01% to 30% so that the reflection of the light may be minimized and the light may be extracted to the outside by controlling the refractive index. The embodiment may provide the light emitting device capable of improving light extraction efficiency while maintaining the reliability of the device.

Figure 2:
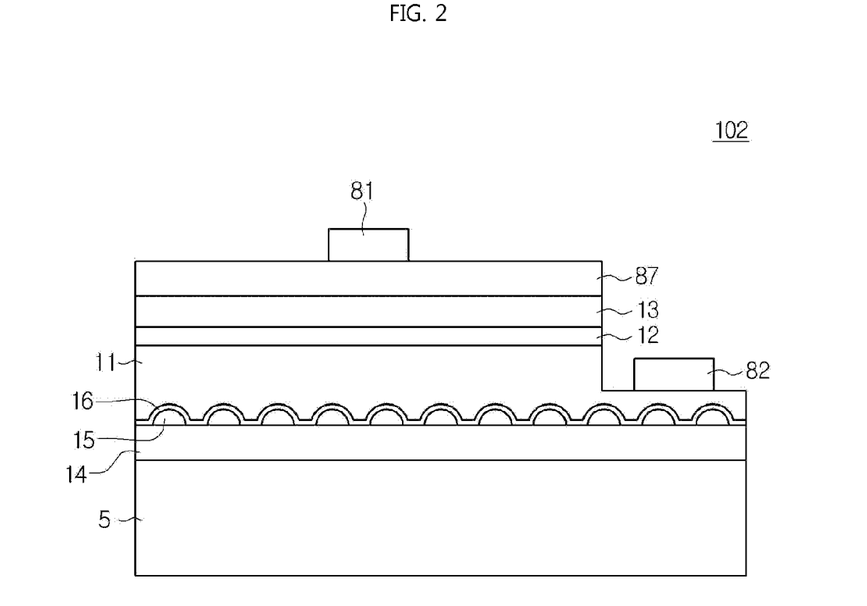
FIG. 2 is a sectional view illustrating a light emitting device according to a second embodiment.

FIG. 2 is a sectional view illustrating a light emitting device 102 according to a second embodiment. The second embodiment may adopt the technical features and effects of the first embodiment.

The light emitting device 102 according to a second embodiment may include a substrate 5, a gallium nitride GaN semiconductor layer 14 on the substrate 5, an InxGa1-xN pattern (where, 0⟨x≤1) 15 on the gallium nitride GaN semiconductor layer 14, an AlyGax1-yN layer (where, 0⟨y≤1) 16 on the InxGa1-xN pattern 15, a first conductive semiconductor layer 11 on the AlyGa1-yN layer 16, an active layer 12 on the first conductive semiconductor layer 11, and a second conductive semiconductor layer 13 on the active layer 12.

The light emitting device 102 according to the second embodiment has a structure for a lateral type chip, a first electrode layer 87 may be disposed on the second conductive semiconductor layer 13, and the first electrode layer 87 may include a transparent ohmic layer. The first pad electrode 81 and the second pad electrode 82 may be disposed on the first electrode layer 87 and an exposed first conductive semiconductor 11.

The InxGa1-xN pattern 15 is spirally grown on the GaN semiconductor layer 14. The InxGa1-xN pattern 15 may include a section that is convex up. Further, the AlyGa1-yN layer 16 may include a section that is convex up along a surface of the InxGa1-xN pattern 15.

According to the embodiment, an amount of light reflected into an inside of the light emitting device chip can be minimized through a light extraction structure including a convex section having a micro size and formed on the active layer so that the amount of the emitted light can be maximized. The embodiment may provide a light emitting device capable of improving light extraction efficiency while maintaining the reliability of the device.

Hereinafter, the method of manufacturing the light emitting device with reference to FIGS. 3 to 5. Meanwhile, although the embodiments have been described with reference to the first embodiment, the embodiment is not limited thereto.

Figure 3:
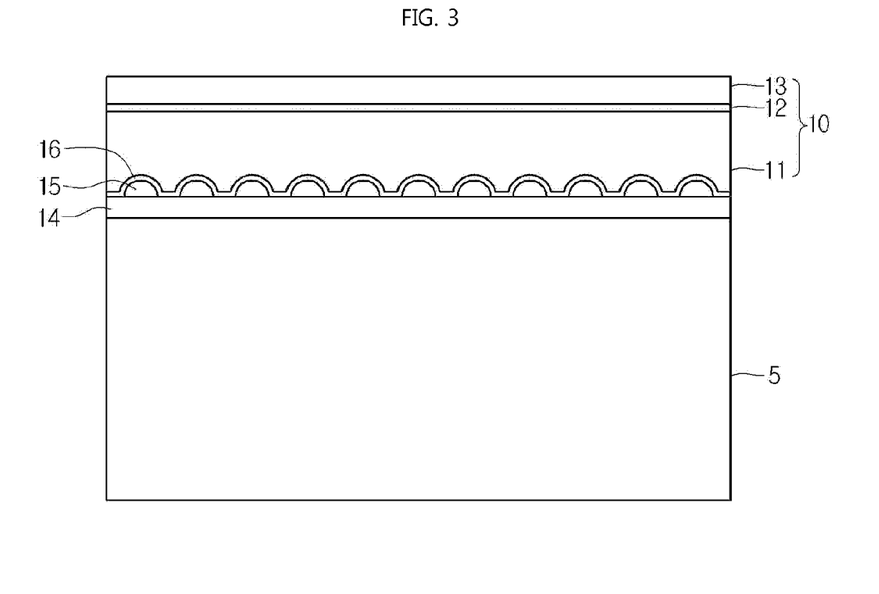
FIGS. 3 to 5 are sectional views illustrating a manufacturing process of the light emitting device according to the embodiment.

According to the method of manufacturing the light emitting device of the embodiment, as shown in FIG. 3, a first conductive semiconductor layer 11, an active layer 12, and a second conductive semiconductor layer 13 may be sequentially formed on a substrate 5. A light emitting structure 10 may be defined by the first conductive semiconductor layer 11, the active layer 12, and the second conductive semiconductor layer 13.

For instance, the substrate 5 may include at least one of Al2O3, SiC, GaAs, GaN, ZnO, Si, GaP, InP, and Ge. A buffer layer (not shown) may be further formed between the first conductive semiconductor layer 11 and the second substrate 5.

For example, the first conductive semiconductor layer 11 may include an N-type semiconductor layer doped with N-type dopants serving as first conductive dopants, and the second conductive semiconductor layer 13 may include a P-type semiconductor layer doped with P-type dopants serving as second conductive dopants. In addition, the first conductive semiconductor layer 11 may include a P-type semiconductor layer, and the second conductive semiconductor layer 13 may include an N-type semiconductor layer.

For example, the first conductive semiconductor layer 11 may include an N-type semiconductor layer. For example, the first conductive semiconductor layer 11 may be realized by using a semiconductor material having a compositional formula of $In_x Al_y Ga_{1-x-y}N$ (0≤x≤1, 0≤y≤1, 0≤x+y≤1). For example, the first conductive semiconductor layer 11 may include one selected from the group consisting of GaN, AlN, AlGaN, InGaN, InN, InAlGaN, AlInN, AlGaAs, GaP, GaAs, GaAsP, and AlGaInP doped with N-type dopants such as Si, Ge, Sn, Se, and Te.

The active layer 12 emits light having a wavelength corresponding to the energy band gap difference according to materials constituting the active layer 12 through the combination of electrons (or holes) injected through the first conductive semiconductor layer 11 and holes (or electrons) injected through the second conductive semiconductor layer 13. The active layer 12 may have one of a single quantum well (SQW) structure, a multi-quantum well (MQW) structure, a quantum dot structure, and a quantum wire structure, but the embodiment is not limited thereto.

The active layer 12 may be realized by using a semiconductor material having a compositional formula of $In_x Al_y Ga_{1-x-y}N$ (0≤x≤1, 0≤y≤1, 0≤x+y≤1). When the active layer 12 has an MQW structure, the active layer 12 may be formed by stacking a plurality of well layers and a plurality of barrier layers. For example, the active layer 12 may have a cycle of InGaN well layer/GaN barrier layer.

For example, the second conductive semiconductor layer 13 may include a P-type semiconductor layer. For example, the second conductive second semiconductor layer 13 may be realized by using a semiconductor material having a compositional formula of $In_x Al_y Ga_{1-x-y}N$ (0≤x≤1, 0≤y≤1, 0≤x+y≤1). For example, the second conductive semiconductor layer 13 may include one selected from the group consisting of GaN, AlN, AlGaN, InGaN, InN, InAlGaN, AlInN, AlGaAs, GaP, GaAs, GaAsP, and AlGaInP doped with P-type dopants such as Mg, Zn, Ca, Sr, and Ba.

Meanwhile, the first conductive semiconductor layer 11 may include a P-type semiconductor layer and the second conductive semiconductor layer 13 may include the N-type semiconductor layer. In addition, a semiconductor layer including an N-type or P-type semiconductor layer may be additionally provided under the second conductive semiconductor layer 13. Accordingly, the first light emitting structure 10 may have at least one of an NP junction structure, a PN junction structure, an NPN junction structure, or a PNP junction structure. In addition, impurities may be doped into the first conductive semiconductor layer 11 and the second conductive semiconductor layer 13 with uniform or non-uniform doping concentration. In other words, the first light emitting structure 10 may have various structures, and the embodiment is not limited thereto.

In addition, a first conductive InGaN/GaN super-lattice structure or InGaN/InGaN super-lattice structure may be formed between the first conductive semiconductor layer 11 and the active layer 12. In addition, a second conductive AlGaN layer may be formed between the second conductive semiconductor layer 13 and the active layer 13.

The embodiment provides the light emitting device capable of improving the light extraction efficiency while maintaining the reliability of the device by preventing an epitaxial layer from being damaged by controlling a refractive index and a shape of the light extraction pattern during a growth of the epitaxial layer. To this end, after the GaN semiconductor layer 14 is formed on a substrate 5, the $In_xGa_{1-x}N$ pattern (where, $0 \langle x \leq 1$) 15 is formed on the GaN semiconductor layer 14, and the $Al_yGa_{1-y}N$ layer (where, $0 \langle y \leq 1$) 16 is formed on the $In_xGa_{1-x}N$ pattern 15, the first conductive semiconductor layer 11 may be formed on the $Al_yGa_{1-y}N$ layer 16, the active layer 12 may be formed on the first conductive semiconductor layer 11, and the second conductive semiconductor layer 13 may be formed on the active layer 12.

The GaN semiconductor layer 14 may include a GaN layer, but the embodiment is not limited thereto. The GaN semiconductor layer 14 may include an undoped semiconductor layer or an N-type semiconductor layer, but the embodiment is not limited thereto. The $In_xGa_{1-x}N$ pattern 15 may be spirally grown on the GaN semiconductor layer 14, for example, a GaN layer through an MOCVD under reduction of an amount of trimethylgallium TMGa.

The $In_xGa_{1-x}N$ pattern 15 may have an island shape. The $In_xGa_{1-x}N$ pattern 15 having the separated island shape may be obtained by predepositing the disilane on the GaN semiconductor layer 14. The $In_xGa_{1-x}N$ pattern 15 having the island shape of a nano scale may very effectively serve as a light extraction pattern.

Further, if Si is predeposited on the GaN semiconductor layer 14, a side strain is attenuated so that the $In_xGa_{1-x}N$ pattern 15 having the separated island shape may be obtained upon deposition of the $In_xGa_{1-x}N$ pattern 15. The $In_xGa_{1-x}N$ pattern 15 may be grown to have a diameter in the range of about 100 nm to about 400 nm. The diameter of the $In_xGa_{1-x}N$ pattern 15 may be increased under reduction of a growth rate or reduction of an amount of the trimethyl gallium TMGa.

An amount of light reflected into an inside of the light emitting device chip can be minimized through a light extraction structure including a convex section having a micro size and formed on the active layer so that the amount of the emitted light can be maximized. Further, the embodiment may provide a light emitting device including a reproducible and controllable light extraction pattern.

When a diameter of a convex section of the $In_xGa_{1-x}N$ pattern 15 is smaller than wavelength of the light, the $In_xGa_{1-x}N$ pattern 15 can be formed by a plurality of layers having graded refractive indexes so that the light may be extracted to the outside without substantial reflection.

Further, when the diameter of the convex section of the $In_xGa_{1-x}N$ pattern 15 is similar to the wavelength of the light, the $In_xGa_{1-x}N$ pattern 15 may serve as a scattering center to change a direction of an incident light so that the light extraction efficiency can be increased.

Figure 4:
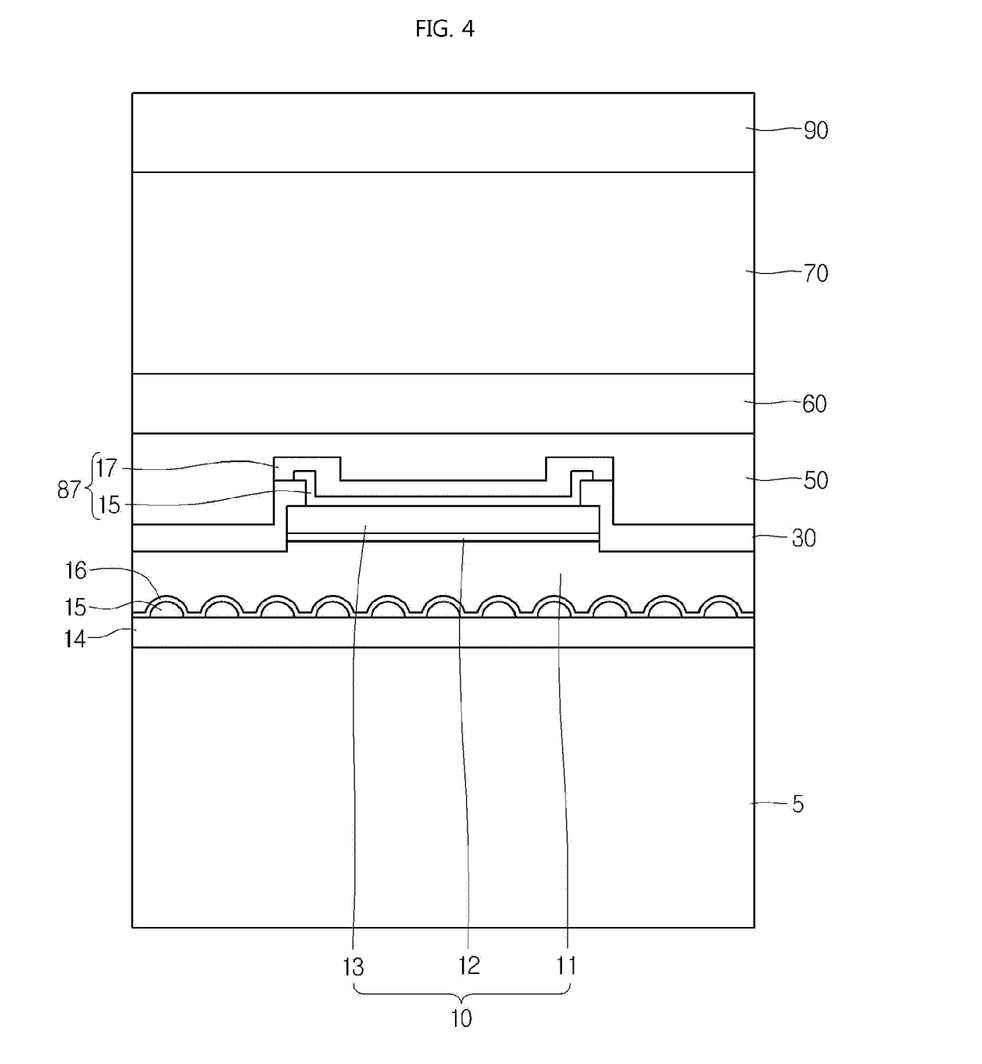

As shown in FIG. 4, a partial region of the first conductive semiconductor layer 11 may be exposed by etching the light emitting structure. In this case, the etching may include wet etching or dry etching. After that, a channel layer 30, an ohmic contact pattern 15, and a reflective layer 17 may be sequentially formed on the light emitting structure 10. For example, the channel layer 30 may include at least one selected from the group consisting of, $SiO_2$, $Si_xO_y$, $Si_3N_4$, $Si_xN_y$, $SiO_xN_y$, $Al_2O_3$, $TiO_2$, and AlN.

The ohmic contact layer 15 may be interposed between the reflective layer 17 and the second conductive semiconductor layer 13. The ohmic contact layer 15 may make contact with the second conductive semiconductor layer 13. The ohmic contact layer 15 may make ohmic-contact with the light emitting structure 10. The reflective layer 17 may be electrically connected to the second conductive semiconductor layer 13. The ohmic contact layer 15 may include a region that makes ohmic-contact with the light emitting structure 10.

For example, the ohmic contact layer 15 may include a transparent conductive oxide layer. For example, the ohmic contact layer 15 may include at least one selected from the group consisting of an ITO (Indium Tin Oxide), an IZO (Indium Zinc Oxide), an AZO (Aluminum Zinc Oxide), an AGZO (Aluminum Gallium Zinc Oxide), an IZTO (Indium Zinc Tin Oxide), an IAZO (Indium Aluminum Zinc Oxide), an IGZO (Indium Gallium Zinc Oxide), an IGTO (Indium Gallium Tin Oxide), an ATO (Antimony Tin Oxide), a GZO (Gallium Zinc Oxide), an IZON (IZO Nitride), ZnO, IrOx, RuOx, NiO, Pt, Ag, and Ti.

The reflective layer 17 may include a material having high reflectance. For example, the reflective layer 17 may include metal including at least one of Ag, Ni, Al, Rh, Pd, Ir, Ru, Mg, Zn, Pt, Cu, Au, and Hf, and the alloy thereof. In addition, the reflective layer 17 may be formed in a multi-layer of the metal or the alloy thereof and a transmissive conductive material such as an ITO (Indium-Tin-Oxide), an IZO (Indium-Zinc-Oxide), an IZTO (Indium-Zinc-Tin-Oxide), an IAZO (Indium-Aluminum-Zinc-Oxide), an IGZO (Indium-Gallium-Zinc-Oxide), an IGTO (Indium-Gallium-Tin-Oxide), an AZO (Aluminum-Zinc-Oxide), or an ATO (Antimony-Tin-Oxide). For example, according to the embodiment, the reflective layer 17 may include at least one of Ag, Al, an Ag—Pd—Cu alloy, and an Ag—Cu alloy.

For example, the reflective layer 17 may have a structure in which an Ag layer and a Ni layer are alternately formed, and may include Ni/Ag/Ni or a Tl layer, and a Pt layer. In addition, the first ohmic contact layer 15 may be provided under the reflective layer 17, and at least a portion of the ohmic contact layer 15 may make ohmic-contact with the light emitting structure 10 through the reflective layer 17.

Next, a metal layer 50, a bonding layer 60, and a support member 70 may be sequentially formed on the reflective layer 17. The metal layer 50 may include at least one of Au, Cu, Ni, Ti, Ti—W, Cr, W, Pt, V, Fe, and Mo. The metal layer 50 may serve as a diffusion barrier layer.

A first electrode layer electrically connected to the second conductive semiconductor layer 13 may include at least one of a reflective layer, an ohmic contact layer, and a metal layer. According to the embodiment, the first electrode layer may include all of the reflective layer, the ohmic contact layer, and the metal layer, and, or may include one or two selected from the reflective layer, the ohmic contact layer, and the metal layer.

The metal layer 50 may prevent a material included in the bonding layer 60 from being diffused to the reflective layer 17 in the process of providing the bonding layer 60. The metal layer 50 may prevent a material, such as Sn, included in the bonding layer 60 from exerting an influence on the reflective layer 17.

The bonding layer 60 includes barrier metal or bonding metal. For example, the bonding layer 60 may include at least one of Ti, Au, Sn, Ni, Cr, Ga, In, Bi, Cu, Ag, Nb, Pd and Ta. The support member 70 may support the light emitting structure 10 according to the embodiment while performing a heat radiation function. The bonding layer 60 may be realized in the form of a seed layer.

The support member 70 may include at least one of semiconductor substrates (e.g., Si, Ge, GaN, GaAs, ZnO, SiC, and SiGe substrates) implanted with Ti, Cr, Ni, Al, Pt, Au, W, Cu, Mo, Cu—W, or impurities. Further, the support member 70 may include an insulation material.

The temporary substrate 90 may be formed on the support member 70. The temporary substrate 90 may include at least one of a metallic material, a semiconductor material, and an insulation material.

Figure 5:
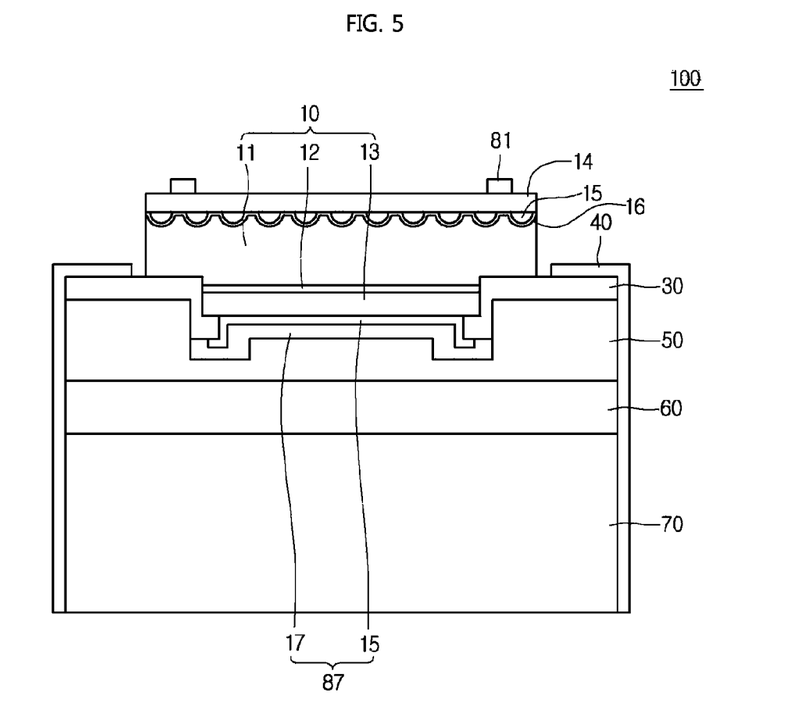

Next, as shown in FIG. 5, the temporary substrate 5 is removed from the GaN semiconductor layer 14. According to one example, the temporary substrate 5 may be removed through a laser lift off (LLO) process. The LLO process is a process to delaminate the temporary substrate 5 from the GaN semiconductor layer 14 by irradiating a laser to the bottom surface of the temporary substrate 5.

Next, an isolation etching process, a process of forming the pad electrode 81, a scribing process, a process of forming a reflective part 40, and a process of removing the temporary substrate 90 may be sequentially performed. The above processes are illustrative purpose only and the sequence of the processes may be variously modified as necessary.

The lateral side of the light emitting structure 10 is etched through the isolation etching process to expose a portion of the channel layer 30. The isolation etching process may be performed through a dry etching process such as an inductively coupled plasma (ICP), but the embodiment is not limited thereto.

The roughness may be formed on the top surface of the light emitting structure 10. Accordingly, a light extraction pattern may be provided on the top surface of the light emitting structure 10. A concave-convex pattern may be provided on the top surface of the light emitting structure 10. For example, the light extraction pattern provided on the light emitting structure 10 may be formed through a PEC (photo electro chemical) etching process. Therefore, according to the embodiment, the external light extraction effect can be increased.

Thereafter, the pad electrode 81 may be formed on the light emitting structure 10. The pad electrode 81 may be electrically connected to the first conductive semiconductor layer 11. A partial region of the pad electrode 81 may make contact with the first conductive semiconductor layer 11. According to the embodiment, power may be applied to the light emitting structure 10 through the pad electrode 81 and the first electrode layer 87.

The pad electrode 81 may include an ohmic layer, an intermediate layer, and an upper layer. The ohmic layer may include a material selected from the group consisting of Cr, V, W, Ti, and Zn, and may make ohmic-contact. The intermediate layer may be realized by using a material selected from the group consisting of Ni, Cu, and Al. For example, the upper layer may include Au. The pad electrode 81 may include at least one selected from the group consisting of Cr, V, W, Ti, Zn, Ni, Cu, Al, and Au.

Lateral sides of the channel layer 30 and the support member 70 may be exposed by performing the scribing process. Next, the reflective part 40 may be formed at the lateral side of the channel layer 30 and the lateral side of the support member 70. After that, an individual light emitting device may be formed by removing the temporary substrate 90.

The reflective part 40 may be disposed at a top portion of the channel layer 30. The reflective part 40 may make contact with the top portion of the channel layer 30. The reflective part 40 may be disposed at a lateral side of the support member 70. The reflective part 40 may make contact with the lateral side of the support member 70. According to the embodiment, the reflective part 40 may be disposed by connecting a first region disposed at the top portion of the channel layer 30 to a second region disposed at the lateral side of the support member 70.

Further, the reflective part 40 may be disposed at a lateral side of the metal layer 50. The reflective part 40 may make contact with the lateral side of the metal layer 50. The reflective part 40 may be disposed at a lateral side of the bonding layer 60. The reflective part 40 may make contact with the lateral side of the bonding layer 60. The reflective part 40 may be spaced apart from the light emitting structure 10. The reflective part 40 may be electrically insulated from the light emitting structure 10.

The reflective part 40 may be implemented by a material having superior reflectance. For example, the reflective part 40 may include at least one of Ag, Al, and Pt. For example, the reflective part 40 has a thickness in the range of 50 nanometers to 5000 nanometers.

The reflective part 40 may prevent the light emitted from the light emitting structure 10 from being input and absorbed into the channel layer 30, the metal layer 50, the bonding layer 60, and the support member 70. That is, the reflective part 40 may prevent the incident light from the outside from being absorbed and lost in the channel layer 30, the metal layer 50, the boding layer 60, and the support member 70 by reflecting the incident light.

Even when the roughness is formed at one of the lateral side of the channel layer 30, the lateral side of the metal layer 50, the lateral side of the bonding layer 60, and the lateral side of the support member 70, if the reflective part 40 is disposed, the lateral sides of the light emitting device according to the embodiment may be smoothly formed. That is, since the reflective part 40 has the smooth surface, even when the roughness or a burr is formed at one of the lateral side of the channel layer 30, the lateral side of the metal layer 50, the lateral side of the bonding layer 60, and the lateral side of the support member 70 during the scribing process, all lateral sides of the light emitting device according to the embodiment may be smoothly formed.

The embodiment may provide the light emitting device capable of improving light extraction efficiency while maintaining the reliability of the device, the method of manufacturing the same, the light emitting device package, and the lighting system.

Figure 6:
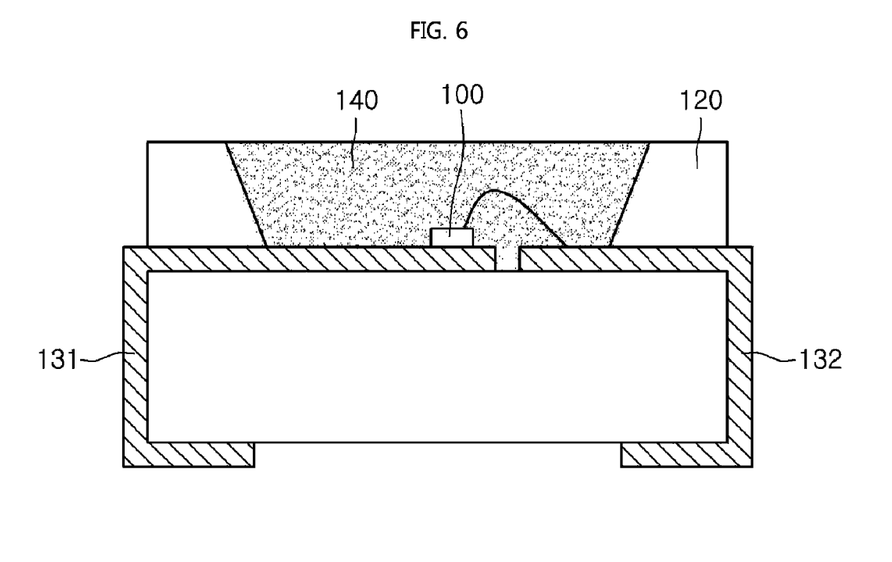
FIG. 6 is a sectional view illustrating a light emitting device package according to the embodiment.

FIG. 6 is a sectional view illustrating a light emitting device package 200 according to the embodiment.

The light emitting device package 200 according to the embodiment includes a package body 120, third and fourth electrode layers 131 and 132 formed on the package body 120, the light emitting device 100 provided on the package body 120 and electrically connected to the third and fourth electrode layers 131 and 132, and a molding member 140 that surrounds the light emitting device 100.

The package body 120 may include silicon, synthetic resin or metallic material. An inclined surface may be formed around the light emitting device 100. The third and fourth electrode layers 131 and 132 may be electrically isolated from each other to supply power to the light emitting device 100. In addition, the third and fourth electrode layers 131 and 132 reflect the light emitted from the light emitting device 100 to improve the light efficiency and dissipate heat generated from the light emitting device 100 to the outside.

The vertical type light emitting device shown in FIG. 1 can be employed as the light emitting device 100, but the embodiment is not limited thereto. The light emitting device 100 may be installed on the package body 120 or the third and fourth electrode layers 131 and 132. The light emitting device 100 may be electrically connected to the third electrode layer 131 and/or the fourth electrode layer 132 through at least one of a wire bonding scheme, a flip chip bonding scheme and a die bonding scheme.

The molding member 140 surrounds the light emitting device 100 to protect the light emitting device 100. In addition, the molding member 140 may include phosphors to change the wavelength of the light emitted from the light emitting device 100.

A plurality of light emitting device packages according to the embodiment may be arrayed on a substrate, and an optical member including a light guide plate, a prism sheet, a diffusion sheet or a fluorescent sheet may be provided on the optical path of the light emitted from the light emitting device package. The light emitting device package, the substrate, and the optical member may serve as a backlight unit or a lighting unit. For instance, the lighting system may include a backlight unit, a lighting unit, an indicator, a lamp or a streetlamp.

Figure 7:
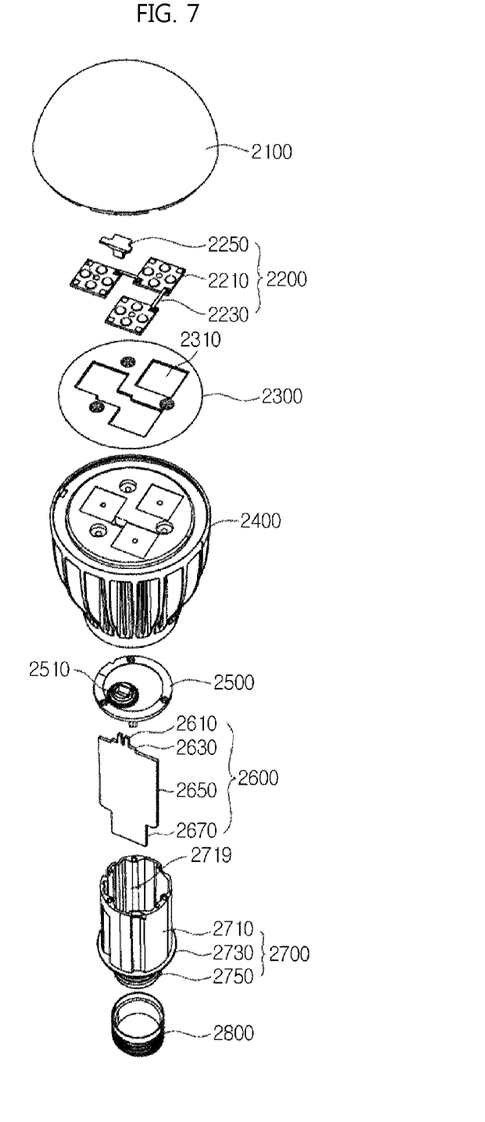
FIG. 7 is an exploded perspective view an example of a lighting system including the light emitting device according to the embodiment.

FIG. 7 is an exploded perspective view an example of a lighting system including the light emitting device according to the embodiment. As shown in FIG. 7, the lighting system according to the embodiment may include a cover 2100, a light source module 2200, a radiator 2400, a power supply part 2600, an inner case 2700, and a socket 2800. The lighting system according to the embodiment may further include at least one of a member 2300 and a holder 2500. The light source module 2200 may include the light emitting device 100 or the light emitting device module 200 according to the embodiment.

For example, the cover 2100 may have a blub shape, a hemisphere shape, a partially-open hollow shape. The cover 2100 may be optically coupled with the light source module 2200. For example, the cover 2100 may diffuse, scatter, or excite light provided from the light source module. The cover 2100 may be a type of optical member. The cover 2100 may be coupled with the radiator 2400. The cover 2100 may include a coupling part which is coupled with the radiator 2400.

The cover 2100 may include an inner surface coated with a milk-white paint. The milk-white paint may include a diffusion material to diffuse light. The cover 2100 may have the inner surface of which surface roughness is greater than that of the outer surface thereof. The surface roughness is provided for the purpose of sufficiently scattering and diffusing the light from the light source module 2200.

For example, a material of the cover 2100 may include glass, plastic, polypropylene (PP), polyethylene (PE), and polycarbonate (PC). The polycarbonate (PC) has the superior light resistance, heat resistance and strength among the above materials. The cover 2100 may be transparent so that a user may view the light source module 2200 from the outside, or opaque. The cover 2100 may be formed through a blow molding scheme.

The light source module 220 may be disposed at one surface of the radiator 2400. Accordingly, the heat from the light source module 220 is transferred to the radiator 2400. The light source module 2200 may include a light source 2210, a connection plate 2230, and a connector 2250.

The member 2300 is disposed at a top surface of the radiator 2400, and includes guide grooves 2310 into which a plurality of light sources 2210 and the connector 2250 are inserted. The guide grooves 2310 correspond to a substrate of the light source 2210 and the connector 2250.

A surface of the member 2300 may be coated with a light reflective material. For example, the surface of the member 2300 may be coated with white paint. The member 2300 again reflects light, which is reflected by the inner surface of the cover 2100 and is returned to the direction of the light source module 2200, to the direction of the cover 2100. Accordingly, the light efficiency of the lighting system according to the embodiment may be improved.

For example, the member 2300 may include an insulating material. The connection plate 2230 of the light source module 2200 may include an electrically conductive material. Accordingly, the radiator 2400 may be electrically connected to the connection plate 2230. The member 2300 may be configured by an insulating material, thereby preventing the connection plate 2230 from being electrically shorted with the radiator 2400. The radiator 2400 receives heat from the light source module 2200 and the power supply part 2600 and radiates the heat.

The holder 2500 covers a receiving groove 2719 of an insulating part 2710 of an inner case 2700. Accordingly, the power supply part 2600 received in the insulating part 2710 of the inner case 2700 is closed. The holder 2500 includes a guide protrusion 2510. The guide protrusion 2510 has a hole through a protrusion of the power supply part 2600.

The power supply part 2600 processes or converts an electric signal received from the outside and provides the processed or converted electric signal to the light source module 2200. The power supply part 2600 is received in the receiving groove of the inner case 2700, and is closed inside the inner case 2700 by the holder 2500.

The power supply part 2600 may include a protrusion 2610, a guide part 2630, a base 2650, and an extension part 2670. The guide part 2630 has a shape protruding from one side of the base 2650 to the outside. The guide part 2630 may be inserted into the holder 2500. A plurality of components may be disposed above one surface of the base 2650. For example, the components may include a DC converter converting AC power provided from an external power supply into DC power, a driving chip controlling driving of the light source module 2200, and an electrostatic discharge (ESD) protection device protecting the light source module 2200, but the embodiment is not limited thereto.

The extension part 2670 has a shape protruding from an opposite side of the base 2650 to the outside. The extension part 2670 is inserted into an inside of the connection part 2750 of the inner case 2700, and receives an electric signal from the outside. For example, a width of the extension part 2670 may be smaller than or equal to a width of the connection part 2750 of the inner case 2700. First terminals of a "+electric wire" and a "−electric wire" are electrically connected to the extension part 2670 and second terminals of the "+electric wire" and the "−electric wire" may be electrically connected to a socket 2800.

The inner case 2700 may include a molding part therein together with the power supply part 2600. The molding part is prepared by hardening molding liquid, and the power supply part 2600 may be fixed inside the inner case 2700 by the molding part.

According to the light emitting device, package and/or system and the method of manufacturing the same, the light extraction efficiency can be increased.

Further, the optical efficiency can be increased.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The embodiment provides a light emitting device capable of improving light extraction efficiency while maintaining the reliability of the device, a method of manufacturing the same, a light emitting device package, and a lighting system.

According to the embodiment, there is provided a light emitting device including: a first electrode layer (87); a second conductive semiconductor layer (13) on the first electrode layer (87); an active layer (12) on the second conductive semiconductor layer (13); a first conductive semiconductor layer (11) on the active layer (12); an AlyGa1-yN layer (where, 0⟨ y≤1) (16) on the first conductive semiconductor layer (11); an InxGa1-xN pattern (where, 0⟨ x≤1) (15) on the AlyGa1-yN layer (16); a gallium nitride semiconductor layer (14) on the InxGa1-xN pattern (15); and a pad electrode (81) on the gallium nitride semiconductor layer (14).

According to the embodiment, there is provided a light emitting device including: a substrate (5); a gallium nitride semiconductor layer (14) on the substrate (5); an InxGa1-xN pattern (where, 0⟨ x≤1) (15) on the gallium nitride semiconductor layer (14); an AlyGa1-yN layer (where, 0⟨ y≤1) (16) on the InxGa1-xN pattern (15); a first conductive semiconductor layer (11) on the AlyGa1-yN layer (16); an active layer (12) on the first conductive semiconductor layer (11); and a second conductive semiconductor layer (13) on the active layer (12).

According to the embodiment, there is provided a lighting system including a light emitting unit including the light emitting device.

The embodiment may provide a light emitting device capable of improving light extraction efficiency while maintaining the reliability of the device, a method of manufacturing the same, a light emitting device package, and a lighting system.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
a first electrode layer;
a second conductive semiconductor layer on the first electrode layer;
an active layer on the second conductive semiconductor layer;
a first conductive semiconductor layer on the active layer;
an $Al_yGa_{1-y}N$ layer (where, 0⟨ y≤1) on the first conductive semiconductor layer;
an $In_xGa_{1-x}N$ pattern (where, 0⟨ x≤1) on the $Al_yGa_{1-y}N$ layer;
a gallium nitride semiconductor layer on the $In_xGa_{1-x}N$ pattern; and
a pad electrode on the gallium nitride semiconductor layer.

2. The light emitting device of claim 1, wherein the $Al_yGa_{1-y}N$ layer comprises a super lattice structure of AlN layer/GaN layer.

3. The light emitting device of claim 1, wherein the $Al_yGa_{1-y}N$ layer comprises a super lattice structure of AlGaN layer/GaN layer.

4. The light emitting device of claim 1, wherein the $In_xGa_{1-x}N$ pattern is spirally grown.

5. The light emitting device of claim 1, wherein the $In_xGa_{1-x}N$ pattern comprises a convex section.

6. The light emitting device of claim 1, wherein the $Al_yGa_{1-y}N$ layer comprises a convex section.

7. The light emitting device of claim 6, wherein the $Al_yGa_{1-y}N$ layer comprises a section that is convex down along a surface of the $In_xGa_{1-x}N$ pattern.

8. The light emitting device of claim 1, wherein the $In_xGa_{1-x}N$ pattern is formed by a plurality of layers having graded refractive indexes.

9. The light emitting device of claim 1, wherein the $In_xGa_{1-x}N$ pattern has a separated island shape.

10. The light emitting device of claim 1, wherein the first electrode layer comprises an ohmic contact pattern and a reflective layer.

11. The light emitting device of claim 10, wherein the ohmic contact pattern is interposed between the reflective layer and the second conductive semiconductor layer.

12. The light emitting device of claim 10, wherein the ohmic contact pattern makes contact with the second conductive semiconductor layer.

13. The light emitting device of claim 10, wherein the reflective layer vertically overlaps with the $Al_yGa_{1-y}N$ layer.

14. The light emitting device of claim 10, wherein the reflective layer vertically overlaps with the $In_xGa_{1-x}N$ pattern.

15. The light emitting device of claim 1, further comprising a light transitive channel layer on a bottom portion of the first conductive semiconductor layer.

16. The light emitting device of claim 15, wherein the light transitive channel layer is vertically overlapped with the $In_xGa_{1-x}N$ pattern (where, $0 < x \le 1$).

17. The light emitting device of claim 15, further comprising a support member under the first conductive semiconductor layer, and
 a reflective part disposed at a lateral side of the light transitive channel layer and a lateral side of the support member.

18. The light emitting device of claim 17, wherein a top surface of the reflective part is disposed between $In_xGa_{1-x}N$ pattern (where, $0 < x \le 1$) and the light transitive channel layer.

19. The light emitting device of claim 1, wherein a lateral width of the $In_xGa_{1-x}N$ pattern (where, $0 < x \le 1$) is greater than a lateral width of the active layer.

* * * * *